United States Patent
Kil et al.

(10) Patent No.: US 7,416,936 B2
(45) Date of Patent: *Aug. 26, 2008

(54) CAPACITOR WITH HAFNIUM OXIDE AND ALUMINUM OXIDE ALLOYED DIELECTRIC LAYER AND METHOD FOR FABRICATING THE SAME

(75) Inventors: Deok-Sin Kil, Ichon-shi (KR); Jae-Sung Roh, Ichon-shi (KR); Hyun-Chul Sohn, Ichon-Shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/802,683

(22) Filed: May 24, 2007

(65) Prior Publication Data
US 2007/0223176 A1 Sep. 27, 2007

Related U.S. Application Data

(63) Continuation of application No. 10/819,294, filed on Apr. 7, 2004, now Pat. No. 7,229,888.

(30) Foreign Application Priority Data
Nov. 22, 2003 (KR) ............ 2003-0083399

(51) Int. Cl.
*H01L 21/8242* (2006.01)

(52) U.S. Cl. ............ 438/240; 438/785; 257/E21.01

(58) Field of Classification Search ............ 438/240, 438/785; 257/E21.01
See application file for complete search history.

(56) References Cited

U.S. PATENT DOCUMENTS 5,733,661 A 3/1998 Ue et al.

(Continued)

FOREIGN PATENT DOCUMENTS

KR 10-2004-0001902 1/2004

(Continued)

OTHER PUBLICATIONS

Notice of Second Office Action from the State Intellectual Property Office of the People's Republic of China mailed Jan. 26, 2007, in Chinese patent application No. 2004-10062627.6, and English translation.

(Continued)

*Primary Examiner*—Trung Dang
(74) *Attorney, Agent, or Firm*—Finnegan, Henderson, Farabow, Garrett & Dunner, L.L.P.

(57) ABSTRACT

The present invention relates to a capacitor having a hafnium oxide and aluminum oxide alloyed dielectric layer and a method for fabricating the same. The capacitor includes: a lower electrode; a dielectric layer formed on the lower electrode; and an upper electrode formed on the dielectric layer, wherein a portion of the dielectric layer contacting one of the lower electrode and the upper electrode is formed by alloying hafnium oxide and aluminum oxide together.

8 Claims, 9 Drawing Sheets

U.S. PATENT DOCUMENTS

| | | |
|---|---|---|
| 6,664,186 B1 | 12/2003 | Callegari et al. |
| 6,686,239 B2 | 2/2004 | Nam et al. |
| 7,199,003 B2 * | 4/2007 | Jeong et al. .................. 438/240 |
| 7,229,888 B2 * | 6/2007 | Kil et al. ..................... 438/393 |
| 2002/0036313 A1 | 3/2002 | Yang et al. |
| 2002/0106536 A1 | 8/2002 | Lee et al. |
| 2003/0062558 A1 | 4/2003 | Yang et al. |
| 2003/0138611 A1 | 7/2003 | Girardie |
| 2003/0148625 A1 | 8/2003 | Ho et al. |
| 2003/0183862 A1 | 10/2003 | Jin et al. |
| 2003/0227033 A1 | 12/2003 | Ahn et al. |
| 2004/0028952 A1 | 2/2004 | Cartier et al. |
| 2004/0033661 A1 | 2/2004 | Yeo et al. |

FOREIGN PATENT DOCUMENTS

| | | |
|---|---|---|
| KR | 10-2004-0079685 | 9/2004 |
| KR | 10-2005-0007496 | 1/2005 |
| WO | WO 02/31875 A2 | 4/2002 |

OTHER PUBLICATIONS

Notice of the Preliminary Rejection from the Korean Intellectual Property Office mailed Jan. 23, 2006, in Korean patent application No. 2003-83399, and English translation.

Notice of the Preliminary Rejection from the Korean Intellectual Property Office mailed Jul. 29, 2005 in Korean patent application No. 2003-83399, and English translation.

* cited by examiner

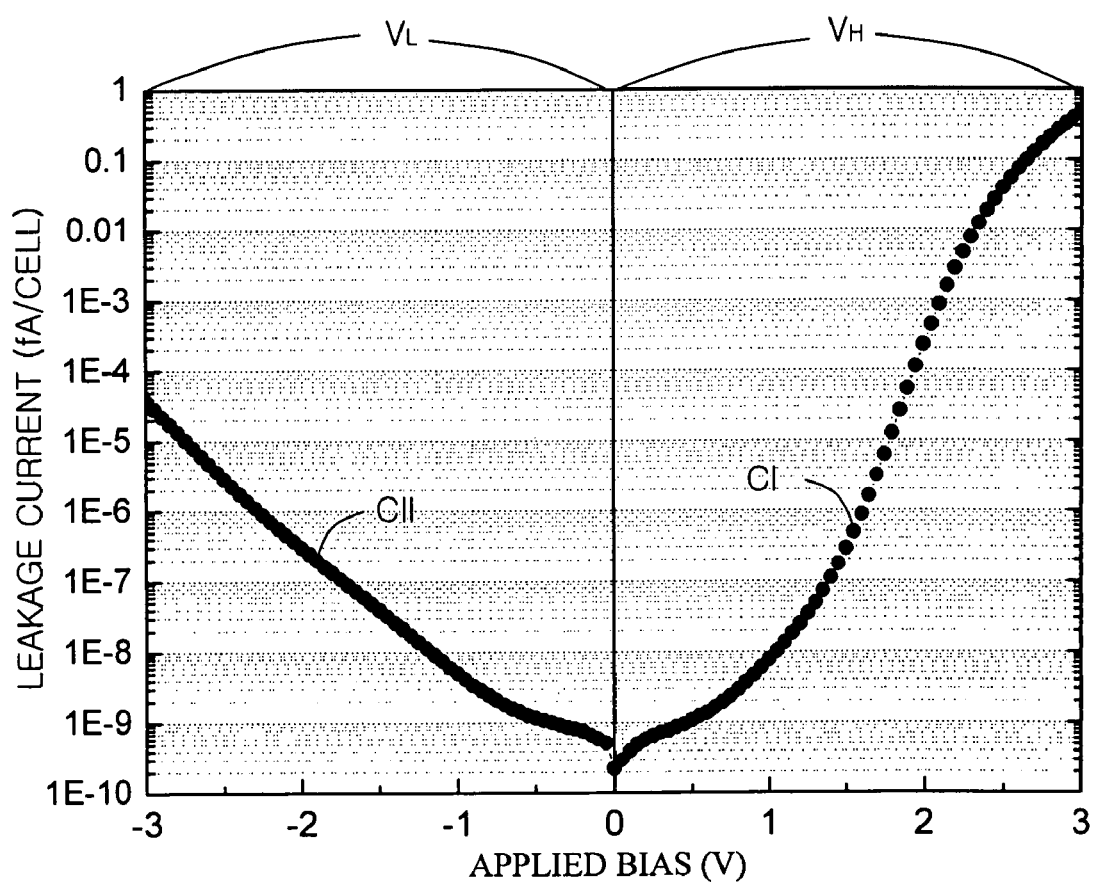

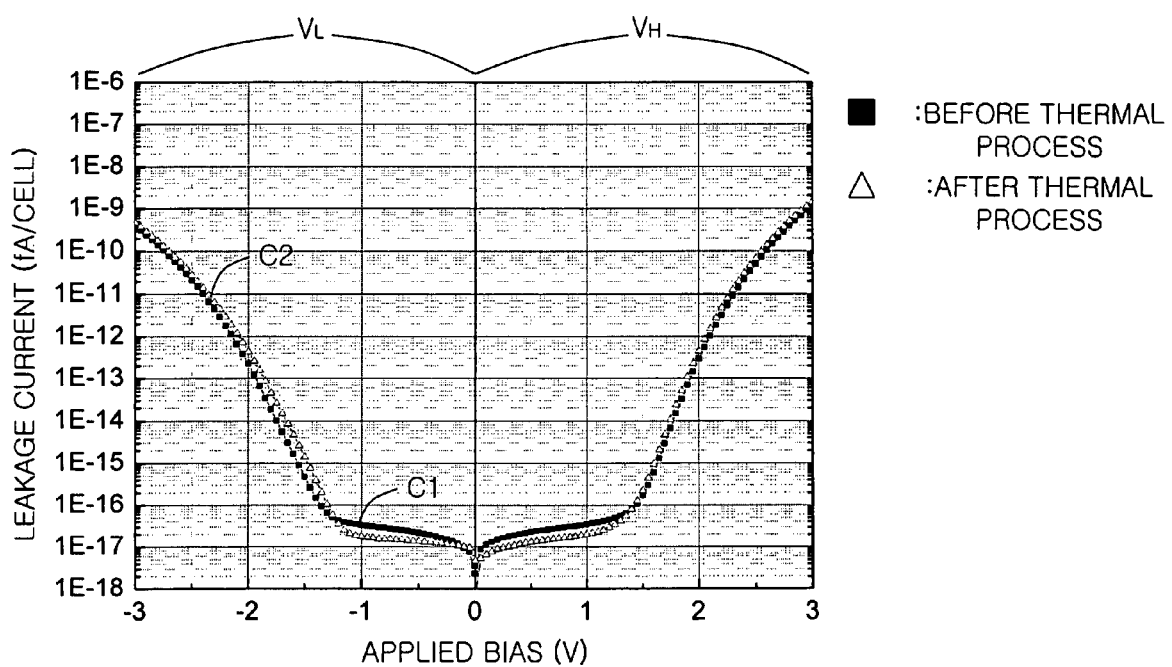

CAPACITOR WITH HAFNIUM OXIDE AND ALUMINUM OXIDE ALLOYED DIELECTRIC LAYER AND METHOD FOR FABRICATING THE SAME

This continuation application claims the benefit of priority of U.S. Patent application Ser. No. 10/819,294, filed Apr. 7, 2004, now U.S. Pat. No. 7,229,888 and Korean Patent Application No. KR 2003-0083399, filed Nov. 22, 2003. The entire contents of these applications are hereby incorporated by reference in their entirety.

FIELD OF THE INVENTION

The present invention relates to a semiconductor device; and, more particularly, to a capacitor of a semiconductor device and a method for fabricating the same.

DESCRIPTION OF RELATED ARTS

In a dynamic random access memory (DRAM) device, a current trend of minimization in the design rule has led to a decrease in a cell area but an increase in an aspect ratio of a storage node. Because of this increased aspect ratio, it is important to secure a sufficient capacitance required for each unit cell. Also, it is necessary to develop a new technology for forming a dielectric layer with a uniform thickness within a structure having an increased aspect ratio.

Particularly, instead of employing a material of oxide-nitride-oxide (ONO), it has been studied on use of a high dielectric material such as aluminum oxide ($Al_2O_3$) and hafnium oxide ($HfO_2$) or a stacked structure of $Al_2O_3$ and $HfO_2$ in order to secure the required capacitance. Herein, $Al_2O_3$ has a dielectric constant of about 8, and $HfO_2$ has a dielectric constant ranging from about 20 to about 25. Also, an atomic layer deposition (ALD) technique is used to form this high dielectric material instead of a chemical vapor deposition (CVD) technique in order to meet a condition for the increased aspect ratio.

It is recently considered that the stacked structure of $HfO_2$ and $Al_2O_3$ is a highly applicable dielectric structure because the stacked structure of $HfO_2$ and $Al_2O_3$ shows a combined characteristic of an excellent dielectric characteristic provided from $HfO_2$ and an excellent leakage current characteristic provided from $Al_2O_3$.

FIG. 1 is a diagram showing a conventional capacitor structure including a stacked dielectric layer of $HfO_2$ and $Al_2O_3$.

As shown, the capacitor includes a lower electrode 11 made of polysilicon, a stacked dielectric layer 12, an upper electrode 13 made of polysilicon. Herein, the stacked dielectric layer 12 is formed by sequentially stacking an $Al_2O_3$ layer 12A and an $HfO_2$ layer 12B.

In the stacked dielectric layer 12, the $Al_2O_3$ layer 12A makes a contact to the lower electrode 11, while the HfO2 layer 12B makes a contact to the $Al_2O_3$ layer 12A. Herein, a required thickness of the $Al_2O_3$ layer 12A is greater than about 20 Å to improve a leakage current characteristic.

The capacitor with the above stacked dielectric layer 12 shows an excellent leakage current characteristic at a low voltage. However, the leakage current abruptly increases at a high voltage, resulting in a low break down voltage. As a result, reliability of the capacitor is further decreased.

FIG. 2 is a graph showing a leakage current characteristic of a conventional capacitor with a stacked dielectric layer formed by stacking an $HfO_2$ layer and an $Al_2O_3$ layer. In FIG. 2, a horizontal axis and a vertical axis express an applied bias and a leakage current, respectively. For measurement of the leakage current, a curve CI is observed in case that an upper electrode is supplied with a positive voltage while a lower electrode is decided to be a ground. On the other hand, a curve CII is observed in cased that an upper electrode is supplied with a negative voltage while a lower electrode is decided to be a ground.

As shown, in a low voltage supply $V_L$ condition, the leakage current characteristic shows a gradually decreasing slope. On the other hand, in a high voltage supply $V_H$ condition, the leakage current characteristic shows a sharply increasing slope. Because of this sharp increase in the leakage current under the high voltage supply $V_H$ condition, there is displayed a low break down voltage in a capacitor. The reason for this result of low break down voltage is because of the aluminum oxide layer that makes a contact to the lower electrode.

Also, the $HfO_2$ layer is formed on the $Al_2O_3$ layer to secure the dielectric characteristic. However, the $HfO_2$ layer is thermally unstable, and thus, the leakage current and dielectric characteristics are degraded by a subsequent thermal process proceeding after formation of the upper electrode.

FIG. 3A is a graph showing a leakage current characteristic of a conventional capacitor having only an $Al_2O_3$ layer when the above mentioned subsequent thermal process is performed. FIG. 3B is a graph showing a leakage current characteristic of a conventional capacitor having a stacked dielectric layer of $HfO_2$ and $Al_2O_3$ when the above mentioned subsequent thermal process is performed. In FIGS. 3A and 3B, the horizontal axis and the vertical axis express an applied bias and a leakage current, respectively. The curves C1 and C3 show the leakage current characteristic before the subsequent thermal process proceeding after formation of an upper electrode, whereas the curves C2 and C4 show the leakage current characteristic after the subsequent thermal process is performed. Herein, the subsequent thermal process proceeds at a temperature of about 750° C. for about 20 minutes and at another temperature of about 675° C. for about 70 minutes.

Referring to FIG. 3A, the capacitor only with the $Al_2O_3$ layer shows a consistency in the leakage current characteristic with regardless of the subsequent thermal process. However, the capacitor with the stacked dielectric layer of $HfO_2$ and $Al_2O_3$ shows a difference in the leakage current characteristics before and after the subsequent thermal process. More specifically, under the same applied bias, the leakage current obtained after the subsequent thermal process is greater than that obtained before the subsequent thermal process. As shown in FIG. 3B, the leakage current may abruptly increase through a grain boundary of the $HfO_2$ crystallized by the subsequent thermal process.

SUMMARY OF THE INVENTION

It is, therefore, an object of the present invention to provide a capacitor capable of preventing a break down voltage from being lowered at a high supply voltage occurring when an aluminum oxide ($Al_2O_3$) layer of a hafnium oxide ($HfO_2$) and aluminum oxide ($Al_2O_3$) stacked dielectric layer directly contacts a lower electrode and a method for fabricating the same.

It is another object of the present invention to provide a capacitor capable of preventing a leakage current from being increased during a subsequent thermal process occurring when a thermally unstable hafnium oxide layer of a hafnium oxide and aluminum oxide stacked dielectric layer contacts an upper electrode and a method for fabricating the same.

In accordance with an aspect of the present invention, there is provided a capacitor, including: a lower electrode; a dielectric layer formed on the lower electrode; and an upper electrode formed on the dielectric layer, wherein a portion of the dielectric layer contacting one of the lower electrode and the upper electrode is formed by alloying hafnium oxide and aluminum oxide together.

In accordance with another aspect of the present invention, there is also provided a capacitor, including: a lower electrode made of polysilicon; an upper electrode made of polysilicon; and a dielectric layer formed between the lower electrode and the upper electrode and alloyed with hafnium oxide and aluminum oxide at a region contacting one of the lower electrode and the upper electrode.

In accordance with still another aspect of the present invention, there is also provided a method for fabricating a capacitor, including the steps of: forming a lower electrode; forming a dielectric layer alloyed with hafnium oxide and aluminum oxide on the lower electrode; and forming an upper electrode on the dielectric layer.

BRIEF DESCRIPTION OF THE DRAWINGS

The above and other objects and features of the present invention will become better understood with respect to the following description of the preferred embodiments given in conjunction with the accompanying drawings, in which:

FIG. 2 is a graph showing a leakage current characteristic of a conventional capacitor with an $HfO_2$ and $Al_2O_3$ stacked dielectric layer;

FIG. 3A is a graph showing a leakage current characteristic of a conventional capacitor having only an $Al_2O_3$ dielectric layer during a subsequent thermal process proceeding after formation of an upper electrode;

DETAILED DESCRIPTION OF THE INVENTION

Hereinafter, detailed descriptions on preferred embodiments of the present invention will be provided with reference to the accompanying drawings.

Figure 1:
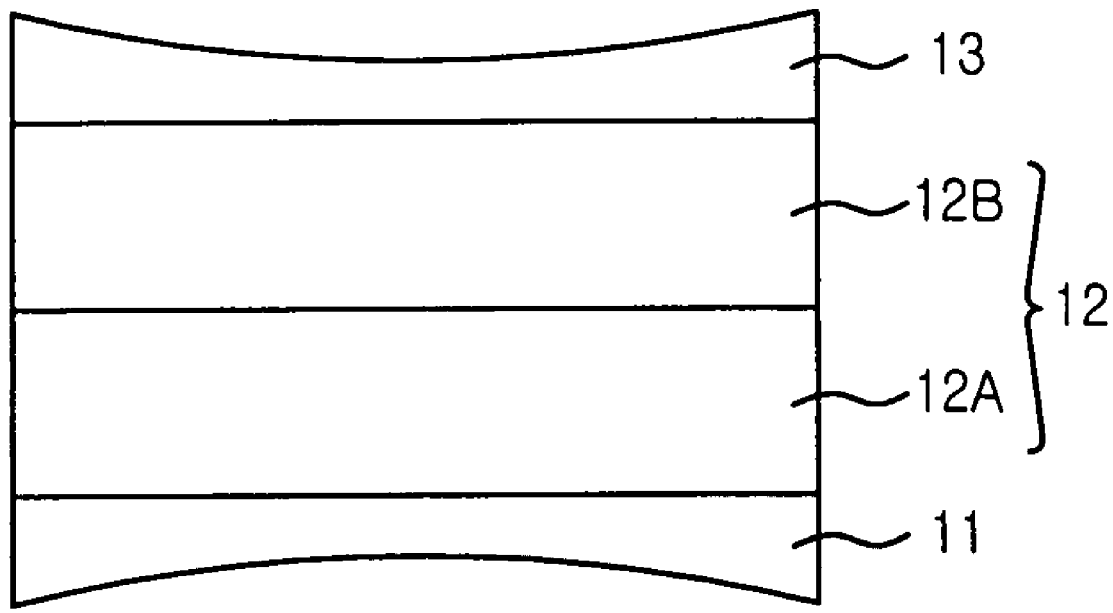
FIG. 1 is a diagram showing a conventional capacitor structure including a hafnium oxide ($HfO_2$) and aluminum oxide ($Al_2O_3$) stacked dielectric layer.
Figure 3B:
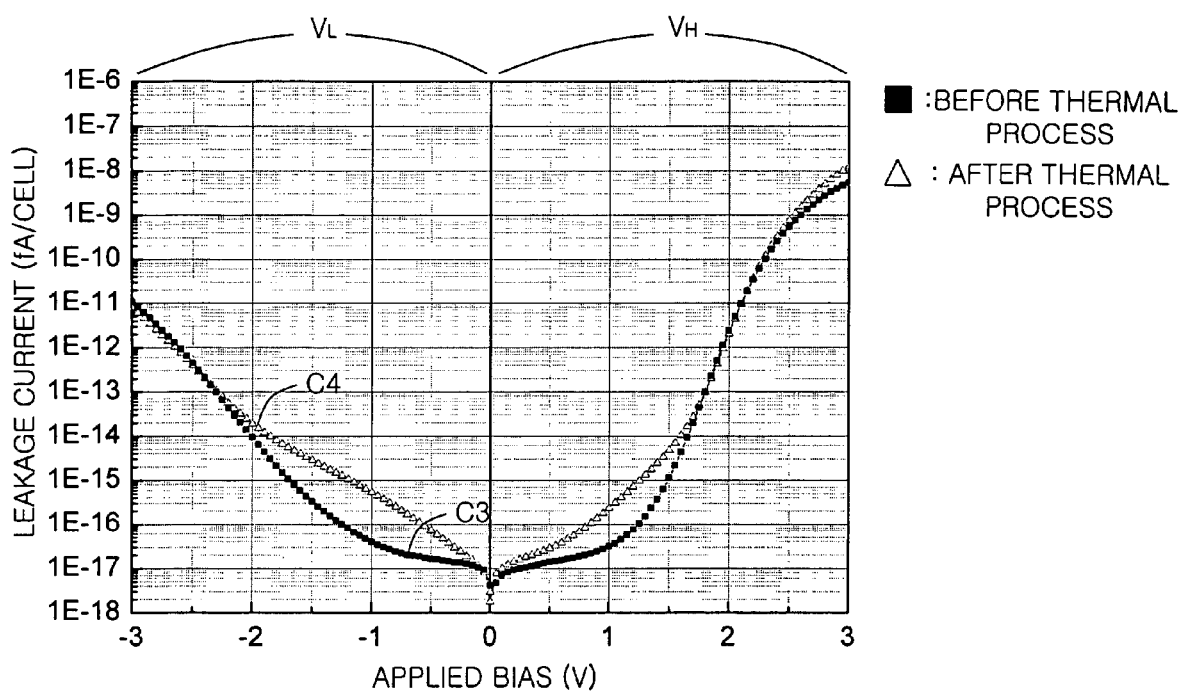
FIG. 3B is a graph showing a leakage current characteristic of a conventional capacitor having an $HfO_2$ and $Al_2O_3$ stacked dielectric layer during a subsequent thermal process proceeding after formation of an upper electrode.
Figure 4:
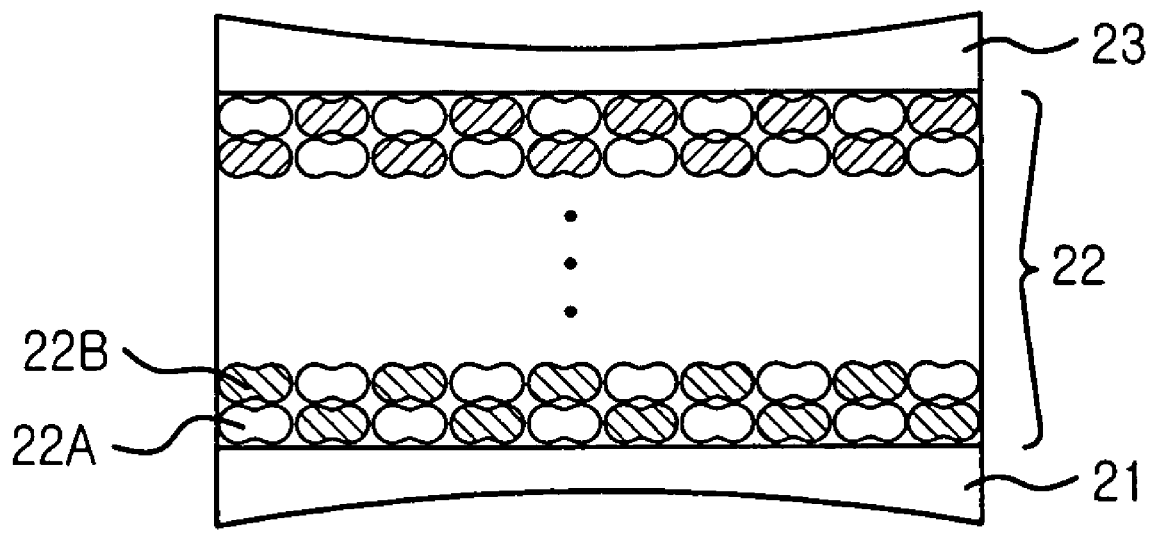
FIG. 4 is a diagram showing a capacitor structure including an $HfO_2$ and $Al_2O_3$ alloyed dielectric layer in accordance with a first preferred embodiment of the present invention.

FIG. 4 is a diagram showing a capacitor structure with a hafnium oxide ($HfO_2$) and aluminum oxide ($Al_2O_3$) alloyed dielectric layer in accordance with a first preferred embodiment of the present invention.

As shown, the capacitor includes a lower electrode 21, an $HfO_2$ and $Al_2O_3$ alloyed dielectric layer 22 and an upper electrode 23. Particularly, the $HfO_2$ and $Al_2O_3$ alloyed dielectric layer 22 is formed by alloying uniformly an $Al_2O_3$ 22A and an $HfO_2$ 22B. Hereinafter, the $HfO_2$ and $Al_2O_3$ alloyed dielectric layer 22 has a molecular structure of $(HfO_2)_{1-x}(Al_2O_3)_x$, in which x represents molecular composition ratio.

More specifically, the lower electrode 21 and the upper electrode 23 are made of a material selected from a group consisting of phosphorus (P) or arsenic (As) doped polysilicon, titanium nitride (TiN), ruthenium (Ru), ruthenium oxide ($RuO_2$), platinum (Pt), iridium (Ir) and iridium oxide ($IrO_2$). For instance, the lower electrode 21 and the upper electrode 23 are made of polysilicon, thereby forming a silicon-insulator-silicon (SIS) capacitor structure. For another example, the lower electrode 21 can be made of polysilicon, and the upper electrode is made of one of metal and metal oxide. Thus, a metal-insulator-metal (MIM) capacitor structure is formed. In addition, the lower electrode 21 can be formed in one of a stack type, a concave type and a cylinder type.

The $HfO_2$ and $Al_2O_3$ alloyed dielectric layer 22 is deposited by employing an atomic layer deposition (ALD) technique. In more detail, a cycle of depositing the $Al_2O_3$ 22A in a unit of atomic layer and a cycle of depositing the $HfO_2$ 22B in a unit of atomic layer are repeatedly performed to deposit the $HfO_2$ and $Al_2O_3$ alloyed dielectric layer 22 with an intended thickness.

In the $HfO_2$ and $Al_2O_3$ alloyed dielectric layer 22, it is not the $Al_2O_3$ 22A that makes a direct contact to the lower electrode 21. Also, it is not the $HfO_2$ 22B that makes a direct contact to the upper electrode 23. These results are possible due to a characteristic of the ALD technique. That is, an atomic layer can be deposited inconsecutively by controlling the number of repeating the cycles. Therefore, in the $HfO_2$ and $Al_2O_3$ alloyed dielectric layer 22, both the $Al_2O_3$ 22A and the $HfO_2$ 22B make contacts to the lower electrode 21 and the upper electrode 23. Hereinafter, the $Al_2O_3$ and $HfO_2$ 22A and 22B each formed in a unit of an atomic layer are referred to as the $Al_2O_3$ layer and the $HfO_2$ layer, respectively.

Hereinafter, a method for forming the $HfO_2$ and $Al_2O_3$ alloyed dielectric layer 22 will be described in more detail.

As described above, the ALD technique is performed to form the $HfO_2$ and $Al_2O_3$ alloyed dielectric layer 22 in a molecular structure of $(HfO_2)_{1-x}(Al_2O_3)_x$, wherein the $Al_2O_3$ layer 22A and the $HfO_2$ layer 22B make contacts to the lower electrode 21 and the upper electrode 23. At this time, the number of repeating each respective cycle of depositing the $Al_2O_3$ layer 22A and the $HfO_2$ layer 22B is controlled until each thickness of the $Al_2O_3$ layer 22A and the $HfO_2$ layer 22B ranges from about 1 Å to about 10 Å. This range of thickness makes each atomic layer formed inconsecutively. Thus, if the thickness is greater than about 10 Å, each atomic layer is formed rather consecutively, thereby forming a stacked structure of $HfO_2$ and $Al_2O_3$.

Figure 5:
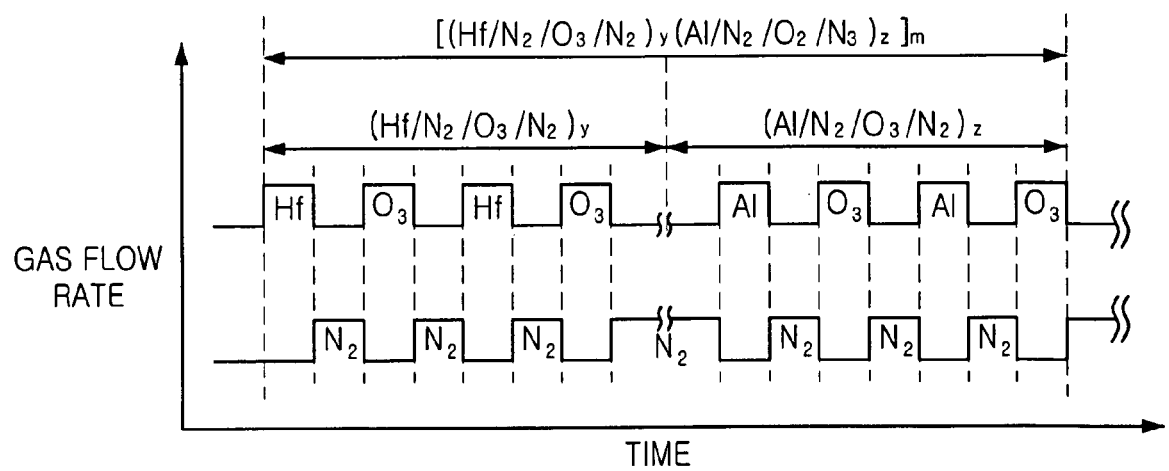
FIG. 5 is a timing diagram showing gas supply to a chamber when the $HfO_2$ and $Al_2O_3$ alloyed dielectric layer is formed by employing an atomic layer deposition (ALD) technique in accordance with the first preferred embodiment of the present invention.

FIG. 5 is a timing diagram showing gas supply to a chamber when the $HfO_2$ and $Al_2O_3$ alloyed dielectric layer 22 is formed by employing the ALD technique in accordance with the first preferred embodiment of the present invention.

As known, a source gas is first supplied to a chamber to make the source gas molecules chemically adsorbed onto a surface of a substrate. Then, those physically adsorbed source gas molecules are purged out by applying a purge gas. A reaction gas is supplied thereto to make the chemically adsorbed source gas molecules react with the reaction gas. From this chemical reaction, a single atomic layer is deposited. Thereafter, the non-reacted reaction gas is purged out by using a purge gas. The above sequential steps constitute one cycle of the single atomic layer deposition. The above ALD technique adopts a surface reaction mechanism to provide a stable and uniform thin layer. Also, compared to a chemical mechanical deposition (CVD) technique, the ALD technique effectively prevents particle generations by a gas phase reaction since the source gas and the reaction gas are separately provided in order and are purged out.

The above mentioned unit cycle for depositing the dielectric layer 22 in a structure of $(HfO_2)_{1-x}(Al_2O_3)_x$ will be described in more detail.

The unit cycle can be expressed as follows.

$$[(Hf/N_2/O_3/N_2)_y(Al/N_2/O_3/N_2)_z]_n \quad \text{Unit cycle 1}$$

Herein, Hf and Al are source gases for forming the $HfO_2$ layer 22B and the $Al_2O_3$ layer 22A, respectively. The subscripts 'y' and 'z' represent the number of repeating a respective cycle of $(Hf/N_2/O_3/N_2)$ and $(Al/N_2/O_3/N_2)$. Another subscript 'n' represents the number of repeating the $[(Hf/N_2/O_3/N_2)_y(Al/N_2/O_3/N_2)_z]$ cycle. Herein, 'y', 'z' and 'n' are a natural number.

More specific to the unit cycle 1, the $(Hf/N_2/O_3/N_2)_y$ cycle expresses sequential steps of providing a source gas of hafnium (Hf), a purge gas of nitrogen ($N_2$), an oxidation agent of ozone ($O_3$), and a purge gas of nitrogen ($N_2$), and this cycle is repeatedly performed y times. Also, the $(Al/N_2/O_3/N_2)_z$ cycle expresses sequential steps of providing a source gas of aluminum (Al), a purge gas of $N_2$, an oxidation agent of $O_3$, and a purge gas of $N_2$, and this cycle is repeatedly performed z times. These cycles are repeated y and z times to respectively deposit a single layer of $HfO_2$ 22B and $Al_2O_3$ 22A with an intended thickness.

For the single atomic layer deposition of the $Al_2O_3$ 22A, a source gas of trimethylaluminum ($Al(CH_3)_3$) maintained with a room temperature is first flowed into a chamber for about 0.1 seconds to about 3 seconds. Hereinafter, trimethylaluminum is referred to as TMA. At this time, the chamber is maintained with a temperature ranging from about 200° C. to about 350° C. and a pressure ranging from about 0.1 torr to about 10 torr. The TMA source gas molecules are adsorbed onto the lower electrode 21. Thereafter, a purge gas of $N_2$ is flowed into the chamber for about 0.1 seconds to about 5 seconds to remove the unadsorbed TMA source gas molecules. Then, an oxidation agent of $O_3$, which is a reaction gas, is flowed into the chamber for about 0.1 seconds to about 3 seconds to induce a reaction between the adsorbed TMA source gas molecules and the $O_3$ gas molecules. As a result of the above reaction, an atomic layer of the $Al_2O_3$ 22A is deposited. Next, a purge gas of $N_2$ is flowed into the chamber for about 0.1 seconds to about 5 seconds to purge out the non-reacted $O_3$ molecules and byproducts of the above reaction.

The above described sequential steps of providing the TMA source gas, the purge gas of $N_2$, the reaction gas of $O_3$, and the purge gas of $N_2$ constitute one unit cycle which is repeatedly performed z times to deposit the $Al_2O_3$ layer 22A with an intended thickness. Herein, in addition to the TMA, modified TMA (MTMA; $Al(CH)_3N(CH_2)_5CH_3$) can be used as the source gas of Al. In addition to the $O_3$ gas, water ($H_2O$) and oxygen ($O_2$) plasma can be used as the oxidation agent. Such inert gas as argon (Ar) can be used as the purge gas as well.

For the single atomic layer deposition of the $HfO_2$ 22B, a source gas selected from a group consisting of $HfCl_4$, $Hf(NO_3)_4$, $Hf(NCH_3C_2H_5)_4$, $Hf[N(CH_3)_2]_4$, and $Hf[N(C_2H_5)_2]_4$ is vaporized at a vaporizer and is flowed into a chamber maintained with a temperature ranging from about 200° C. to about 400° C. and a pressure ranging from about 0.1 torr to about 10 torr to thereby make the Hf source gas molecules adsorbed. A purge gas of $N_2$ is then flowed into the chamber for about 0.1 seconds to about 5 seconds to purge out the unadsorbed Hf source gas molecules. A reaction gas of $O_3$ is flowed into the chamber for about 0.1 seconds to about 3 seconds to induce a reaction between the adsorbed Hf source molecules and the $O_3$ gas molecules. From this chemical reaction, a single atomic layer of the $HfO_2$ 22B is deposited. Next, a purge gas of $N_2$ is flowed into the chamber for about 0.1 seconds to about 5 seconds to purge out the non-reacted $O_3$ gas molecules and byproducts of the above reaction.

The sequential steps of providing the Hf source gas, the purge gas of $N_2$, the reaction gas of $O_3$ and the purge gas of $N_2$ constitutes one unit cycle which is repeatedly performed y times to deposit the $HfO_2$ layer 22B with an intended thickness. In addition to the $O_3$ gas, $H_2O$ and oxygen plasma can be used as the oxidation agent. Such inert gas as Ar can be used as the purge gas as well.

It is well known that the above ALD technique proceeds in a pulse-like unit. The above unit cycle 1 is repeated to form the dielectric layer 22 with a molecular structure of $(HfO_2)_{1-x}(Al_2O_3)_x$, wherein the $HfO_2$ layer 22B and the $Al_2O_3$ layer 22A are uniformly formed in a predetermined molecular composition ratio.

There are conditions to form such dielectric layer 22 with the molecular structure of $(HfO_2)_{1-x}(Al_2O_3)_x$. First, the unit cycle 1 including the cycle of $(Hf/N_2/O_3/N_2)$ repeatedly performed y times and the cycle of $(Al/N_2/O_3/N_2)$ repeatedly performed z times is repeated n times. However, the number of repeating each of the two cycles, i.e., y and z, is specifically controlled such that the thickness of the $HfO_2$ layer 22B formed by the cycle of $(Hf/N_2/O_3/N_2)$ and that of the $Al_2O_3$ layer 22A formed by the cycle of $(Al/N_2/O_3/N_2)$ range from about 1 Å to about 10 Å in order to maximize an effect of uniformly alloying the $HfO_2$ and $Al_2O_3$ together. If the thickness of each single atomic layer is greater than about 10 Å, each single atomic layer shows a characteristic of consecutiveness, resulting in the same conventional $HfO_2$ and $Al_2O_3$ stacked dielectric layer or even more a degraded dielectric characteristic.

Second, the ratio of repeating the number of the two cycles, i.e., y and z, needs to be controlled appropriately to make the $Al_2O_3$ layer 22A in a ratio ranging from about 30% to about 60% in order to obtain an excellent electric characteristic by forming an amorphous thin dielectric layer through the alloying of the $HfO_2$ and $Al_2O_3$ layers 22B and 22A.

Figure 6:
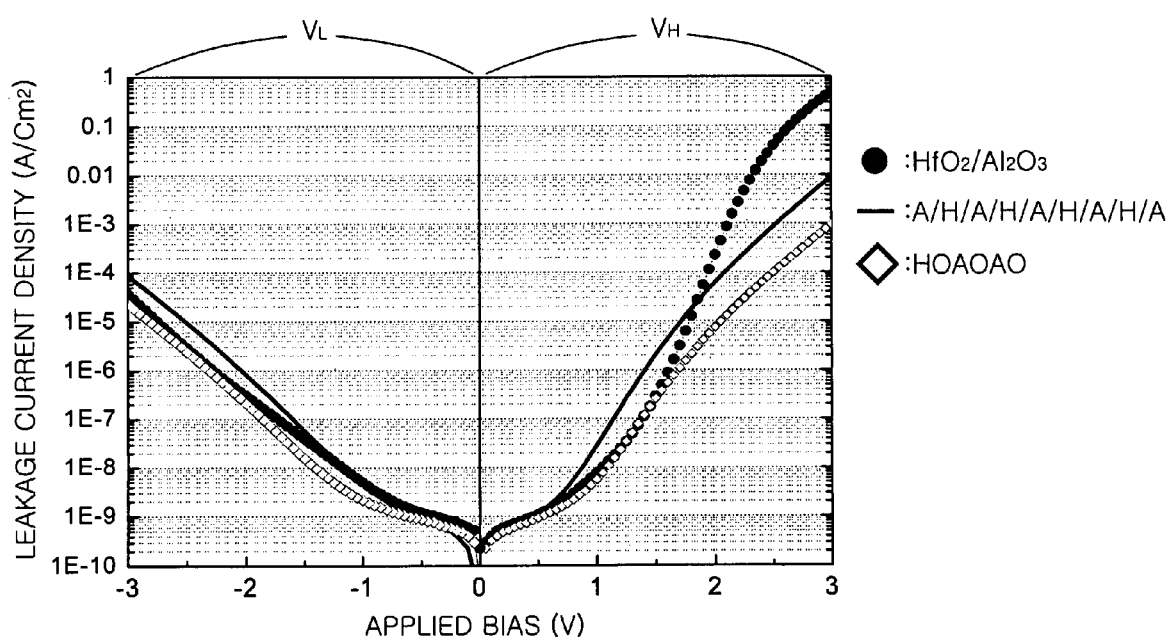
FIG. 6 is a graph showing leakage current characteristics of a $HfO_2$ and $Al_2O_3$ stacked dielectric layer, a [A/H/A/H/A/H/A/H/A] laminated dielectric layer and a [HOAOAO] alloyed dielectric layer, in which 'A', 'H' and 'O' represent atoms or molecules

FIG. 6 is a graph showing leakage current characteristics of an $HfO_2$ and $Al_2O_3$ stacked dielectric layer, a [A/H/A/H/A/H/A/H/A] laminated layer and a [HOAOAO] alloyed layer. The leakage current characteristics are obtained when the above listed layers are applied as a dielectric layer of a capacitor. Herein, 'A', 'H' and 'O' represent atoms or molecules employed to form a specific structure of the above intended layer.

As shown, the $HfO_2$ and $Al_2O_3$ stacked dielectric layer is formed by stacking $HfO_2$ and $Al_2O_3$ with a respective thickness of about 20 Å and of about 25 Å. The [A/H/A/H/A/H/A/H/A] laminated layer is formed by alternatively stacking $Al_2O_3$ and $HfO_2$ each with a thickness of about 10 Å. The [HOAOAO] alloyed layer is formed by performing the unit cycle of $(Hf/N_2/O_3/N_2)_1(Al/N_2/O_3/N_2)_2$ in accordance with the first preferred embodiment of the present invention.

More specific to the leakage current characteristics of the above mentioned layers in FIG. 6, the [HOAOAO] alloyed layer formed on the basis of the first preferred embodiment shows a low leakage current characteristic in a low voltage supply $V_L$ condition just like the $HfO_2$ and $Al_2O_3$ stacked dielectric layer due to a contact characteristic of the $Al_2O_3$ layer. Also, the [HOAOAO] alloyed layer exhibits a high take-off voltage characteristic in the low voltage supply $V_L$ condition. Herein, the take-off voltage is a voltage wherein a leakage current sharply increases. However, the [HOAOAO] alloyed layer shows a high break down voltage characteristic in a high voltage supply $V_H$ condition due to a pronounced contact characteristic of the $HfO_2$ over that of the $Al_2O_3$. That is, in the high voltage supply $V_H$ condition, leakage currents of the [HOAOAO] alloyed layer increase in a gradual slope. Contrary to the [HOAOAO] alloyed layer, leakage currents of the $HfO_2$ and $Al_2O_3$ stacked dielectric layer and the [A/H/A/H/A/H/A/H/A] laminated layer sharply increase in a steep slope. Also, under the identical high voltage supply $V_H$ condition, the [HOAOAO] alloyed layer has a low leakage current density compared to the other layers.

The above characteristic leakage current behavior of the [HOAOAO] alloyed layer even in the high voltage supply $V_H$ condition is because a defect with negative charges typically existing in the $Al_2O_3$ layer and a defect with positive charges typically existing in the $HfO_2$ layer are offset against each other. Therefore, compared to the $HfO_2$ and $Al_2O_3$ stacked dielectric layer, the [HOAOAO] alloyed dielectric layer shows an excellent leakage current characteristic in both of the low voltage supply $V_L$ condition and the high voltage supply $V_H$ condition.

Also, in the [HOAOAO] alloyed layer, a direct contact of the $HfO_2$ layer to an upper electrode and a lower electrode is minimized, thereby suppressing degradation of the leakage current and dielectric characteristics caused by a thermal process performed after formation of the upper electrode.

Figure 7:
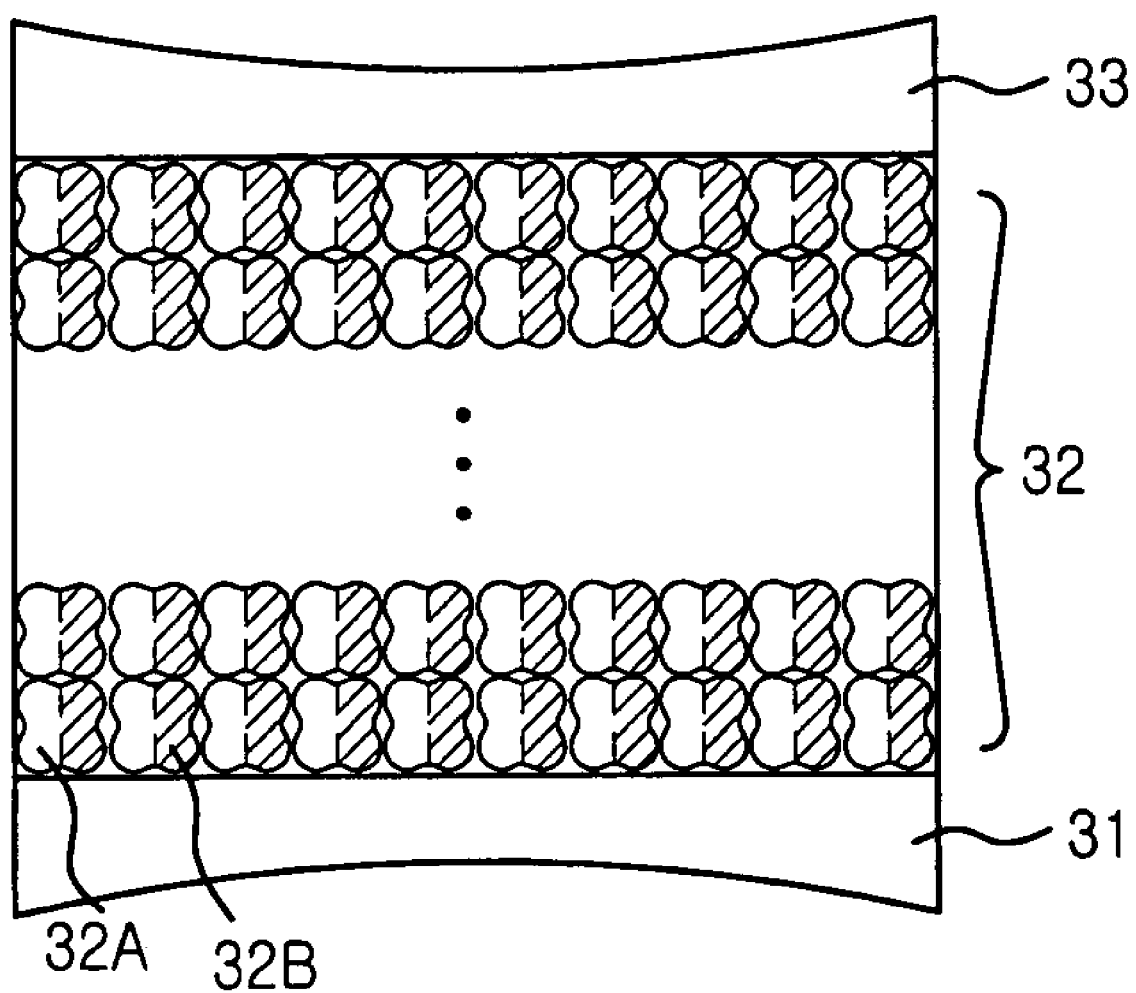
FIG. 7 is a diagram showing a capacitor structure including an $HfO_2$ and $Al_2O_3$ alloyed dielectric layer in accordance with a second preferred embodiment of the present invention.

FIG. 7 is a diagram showing a capacitor structure in accordance with a second preferred embodiment of the present invention.

As shown, the capacitor includes a lower electrode 31, a hafnium oxide ($HfO_2$) and aluminum oxide ($Al_2O_3$) dielectric layer 32 and an upper electrode 33. Herein, the lower electrode 31 and the upper electrode 33 are made of polysilicon. Also, the $HfO_2$ and $Al_2O_3$ alloyed dielectric layer 32 is formed by alloying uniformly an $Al_2O_3$ layer 32A and an $HfO_2$ layer 32B. Hereinafter, the $HfO_2$ and $Al_2O_3$ alloyed dielectric layer 32 is formed in a molecular structure of $(HfO_2)_{1-x}(Al_2O_3)_x$, wherein x represents a molecular composition ratio.

Particularly, the $HfO_2$ and $Al_2O_3$ dielectric layer 32 is formed by performing an ALD technique. In more detail, a unit cycle is repeatedly performed to deposit the $HfO_2$ and $Al_2O_3$ alloyed dielectric layer 32 with an intended thickness. This unit cycle is expressed as follows.

$[(Hf-Al)/N_2/O_3/N_2]_w$  Unit cycle 2

Herein, Hf—Al represents a singe molecular source gas, wherein Hf and Al are admixed to exist in a single molecule. Such substance as $HfAl(MMP)_2(OiPr)_5$ is an example of the single molecular source gas of Hf and Al. Herein, MMP and OiPr represent methylthiopropionaldehyde and isopropoxides, respectively.

In the first preferred embodiment, the Hf source gas and the Al source gas are individually supplied as described in the unit cycle 1 of FIG. 5. However, in the second preferred embodiment, the single molecular source gas of Hf and Al is used as shown in the unit cycle 2. This use of the single molecular source gas simplifies the steps of supplying the source gas and further shortens an overall period of the whole cycle. It is possible to control the Hf and Al composition ratio by controlling a ratio of each Hf and Al when Hf and Al are admixed to form a single molecule.

Figure 8:
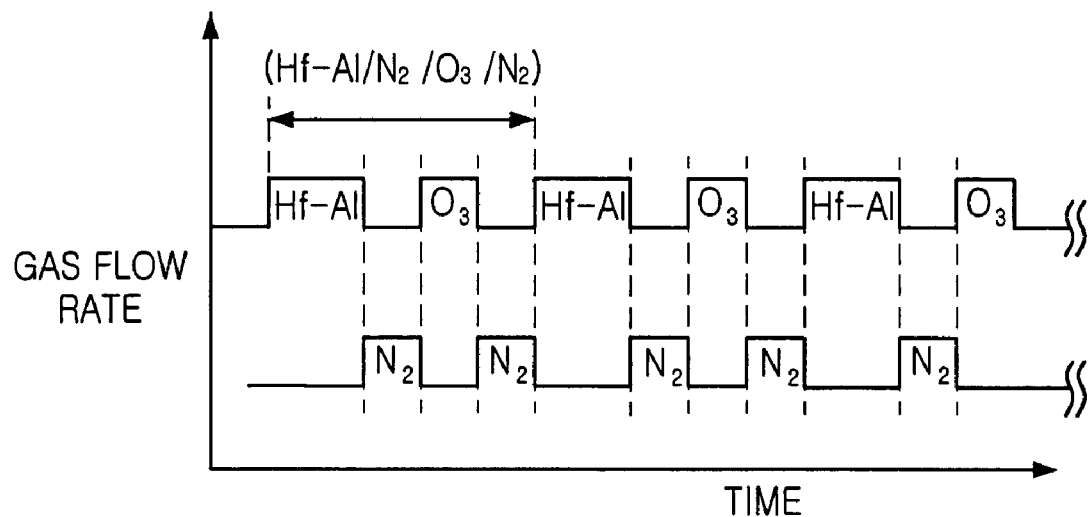
FIG. 8 is a timing diagram showing gas supply to a chamber when the $HfO_2$ and $Al_2O_3$ alloyed dielectric layer is formed by employing an ALD technique in accordance with the second preferred embodiment of the present invention.

FIG. 8 is a timing diagram showing gas supply to a chamber when the $HfO_2$ and $Al_2O_3$ alloyed dielectric layer 32 is formed by employing the ALD technique in accordance with the second preferred embodiment of the present invention.

As shown, the unit cycle of $(Hf-Al/N_2/O_3/N_2)_w$ refers to sequential steps of providing a single molecular source gas of Hf—Al, a purge gas of $N_2$, an oxidation agent of $O_3$, which is the reaction gas, and a purge gas of $N_2$. This cycle is repeated w times until a required thickness of the $HfO_2$ and $Al_2O_3$ alloyed dielectric layer 32 is reached. Herein, 'w' is natural numbers.

The above mentioned unit cycle 2 of the ALD technique will be described in more detail. First, the source gas, e.g., $HfAl(MMP)_2(OiPr)_5$, maintained with a room temperature is flowed into a chamber for about 0.1 seconds to about 3 seconds to make the source gas molecules of $HfAl(MMP)_2(OiPr)_5$ adsorbed. At this time, the chamber is maintained with a temperature ranging from about 200° C. to about 350° C. and a pressure ranging from about 0.1 torr to about 10 torr. Next, the purge gas of $N_2$ is flowed into the chamber for about 0.1 seconds to about 5 seconds to eliminate the non-adsorbed $HfAl(MMP)_2(OiPr)_5$ molecules. Thereafter, the reaction gas of $O_3$ is flowed for about 0.1 seconds to about 3 seconds to induce a reaction between the adsorbed $HfAl(MMP)_2(OiPr)_5$ molecules and the supplied $O_3$ gas. From this reaction, an atomic layer of $(HfO_2)_{1-x}(Al_2O_3)$ constituted with the $HfO_2$ layer 32B and the $Al_2O_3$ layer 32A is deposited. The purge gas of $N_2$ is again flowed into the chamber for about 0.1 seconds to about 5 seconds to purge out the non-reacted $O_3$ gas and byproducts of the reaction.

The above unit cycle 2 including sequential steps of providing the source gas of $HfAl(MMP)_2(OiPr)_5$, the purge gas of $N_2$, the reaction gas of $O_3$ and the purge gas of $N_2$ is repeated w times until an intended thickness of the $HfO_2$ and $Al_2O_3$ alloyed dielectric layer 32 is reached. Meanwhile, in addition to the $O_3$ gas, $H_2O$ and oxygen plasma can be used as the oxidation agent. Such inert gas as Ar can also be used as the purge gas as well.

Figure 9:
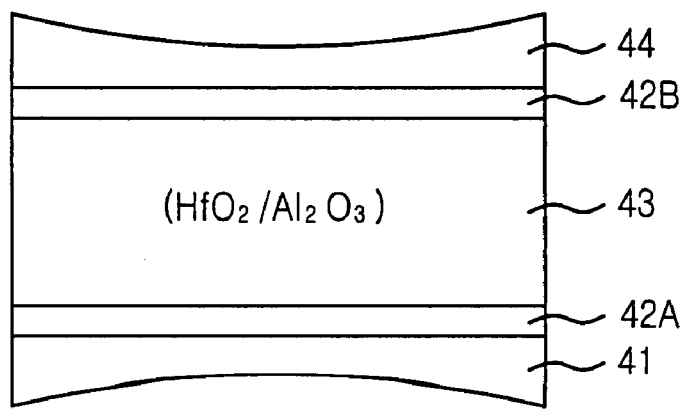
FIG. 9 is a diagram showing a capacitor structure in accordance with a third preferred embodiment of the present invention.

FIG. 9 is a diagram showing a capacitor structure in accordance with a third preferred embodiment of the present invention.

As shown, the capacitor includes a lower electrode 41, a first hafnium oxide ($HfO_2$) and aluminum oxide ($Al_2O_3$) alloyed dielectric layer 42A, a hafnium oxide ($HfO_2$) and aluminum oxide ($Al_2O_3$) stacked dielectric layer 43, a second hafnium oxide ($HfO_2$) and aluminum oxide ($Al_2O_3$) alloyed dielectric layer 42B and an upper electrode 44.

Particularly, the lower electrode 41 and the upper electrode 44 are made of a material selected from a group consisting of P or As doped polysilicon, TiN, Ru, $RuO_2$, Pt, Ir and $IrO_2$. For instance, the lower electrode 41 and the upper electrode 44 are made of polysilicon, thereby forming a SIS capacitor structure. For another example, the lower electrode 41 is made of polysilicon, while the upper electrode 44 is made one of metal and metal oxide. This capacitor structure is called MIS. Also, both the lower electrode 41 and the upper electrode 44 are made of one of metal and metal oxide, thereby forming a metal-insulator-metal (MIM) capacitor structure. In addition, the lower electrode 41 can be formed in one of a stack type, a concave type and a cylinder type.

The first and the second $HfO_2$ and $Al_2O_3$ alloyed dielectric layers 42A and 42B have a molecular structure of $(HfO_2)_{1-x}$ $(Al_2O_3)_x$ formed by repeatedly performing the above-described unit cycle 1 and the unit cycle 2 of the ALD technique. Because of this alloyed structure formed trough the ALD technique, it is not solely an $Al_2O_3$ layer that makes a direct contact to the lower electrode 41 and an $HfO_2$ layer that makes a direct contact to the upper electrode 44. That is, an atomic layer can be formed inconsecutively by controlling the number of repeating the unit cycle.

Eventually, in the third preferred embodiment, both the $Al_2O_3$ and $HfO_2$ of the first and the second $HfO_2$ and $Al_2O_3$ alloyed dielectric layer 42A and 42B make contacts to the lower electrode 41 and the upper electrode 44.

Meanwhile, the $HfO_2$ and $Al_2O_3$ stacked dielectric layer 43 disposed between the first $HfO_2$ and $Al_2O_3$ alloyed dielectric layer 42A and the second $HfO_2$ and $Al_2O_3$ alloyed dielectric layer 42B is formed by sequentially stacking the $HfO_2$ layer and the $Al_2O_3$ layer or vice versa. Hereinafter, the dielectric layers sequentially stacked in order of $HfO_2$ and $Al_2O_3$ and in order of $Al_2O_3$ and $HfO_2$ are denoted as the $Al_2O_3/HfO_2$ stacked dielectric layer and the $HfO_2/Al_2O_3$ stacked dielectric layer, respectively. The $HfO_2$ and $Al_2O_3$ stacked dielectric layer 43 is formed by identically using the ALD technique adopted for forming the first and the second $HfO_2$ and $Al_2O_3$ alloyed dielectric layers 42A and 42B. However, the number of repeating the unit cycles increases to form the atomic layers consecutively. For instance, after the first $HfO_2$ and $Al_2O_3$ alloyed dielectric layer 42A is formed by repeating the unit cycle 1 of $[(Hf/N_2/O_3/N_2)_y(Al/N_2/O_3/N_2)_z]$ n times, the cycle of $(Al/N_2/O_3/N_2)$ is repeatedly performed until the $Al_2O_3$ layer is deposited with a thickness ranging from about 6 Å to about 10 Å. Then, the cycle of $(Hf/N_2/O_3/N_2)$ is repeatedly performed until the $HfO_2$ layer is deposited with a thickness ranging from about 6 Å to about 10 Å.

According to the above, in case of using the above unit cycle 1 for depositing the first and the second $HfO_2$ and $Al_2O_3$ alloyed dielectric layers 42A and 42B, the number of repeating each correspondent cycle represented by the respective subscripts y, z and n are controlled to form the $HfO_2$ and $Al_2O_3$ alloyed dielectric layer in a structure of $(HfO_2)_{1-x}$ $(Al_2O_3)_x$, wherein the $HfO_2$ and $Al_2O_3$ are uniformly alloyed. Also, the number of repeating each correspondent cycle represented by the respective subscripts y and z are controlled to form the $HfO_2$ and $Al_2O_3$ stacked layer 43, wherein the $HfO_2$ layer and the $Al_2O_3$ layer are independently deposited.

In the third preferred embodiment of the present invention, the first and the second $HfO_2$ and $Al_2O_3$ alloyed dielectric layer 42A and 42B make contacts to both of the lower electrode 41 and the upper electrode 44. However, it is still possible to form the $HfO_2$ and $Al_2O_3$ alloyed dielectric layer that makes a contact only to the lower electrode 41 or the upper electrode 44.

In accordance with the first to the third preferred embodiments, $HfO_2$ having a good dielectric characteristic and $Al_2O_3$ having a good leakage current characteristic are alloyed together into the same dielectric layer. Thus, a layer that makes a direct contact to the lower electrode contains $HfO_2$, thereby providing an effect of increasing a break down voltage. Also, alloying $HfO_2$ and $Al_2O_3$ into the same dielectric layer allows a layer that makes a direct contact to the upper electrode to contain $Al_2O_3$. Thus, it is possible to decrease leakage currents and further to fabricate a highly qualified capacitor with an excellent dielectric characteristic.

The present application contains subject matter related to the Korean patent application No. KR 2003-0083399, filed in the Korean Patent Office on Nov. 22, 2003, the entire contents of which being incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A method for fabricating a capacitor, comprising the steps of:
   forming a lower electrode;
   forming a dielectric layer alloyed with hafnium oxide and aluminum oxide on the lower electrode; and
   forming an upper electrode on the dielectric layer,
   wherein forming the dielectric layer comprises forming a hafnium oxide and aluminum oxide alloyed layer having a molecular structure of $(HfO_2)_{1-x}(Al_2O_3)_x$, X representing a molecular composition ratio, by repeating a cycle of providing a source gas of hafnium and aluminum bound in a single molecule, a purge gas, an oxidation agent, and a purge gas.

2. The method as recited in claim 1, wherein in the step of forming the hafnium oxide and aluminum oxide alloyed dielectric layer, the hafnium oxide and the aluminum oxide are deposited through the use of an ALD technique.

3. The method as recited in claim 2, wherein:
   a hafnium source gas in the source gas of hafnium and aluminum bound in a single molecule is selected from a group consisting of $HfCl_4$, $Hf(NO_3)_4$, $Hf(NCH_3C_2H_5)_4$, $Hf[N(CH_3)_2]_4$, and $Hf[N(C_2H_5)_2]_4$;
   the oxidation agent is one of $O_3$, $H_2O$, and oxygen plasma; and
   the purge gas is one of $N_2$ and Ar.

4. The method as recited in claim 2, wherein:
   an aluminum source gas in the source gas of hafnium and aluminum bound in a single molecule is one of trimethylaluminum (TMA) and modified TMA (MTMA);
   the oxidation agent is one of $O_3$, $H_2O$, and oxygen plasma; and
   the purge gas is one of $N_2$ and Ar.

5. The method as recited in claim 2, wherein in the molecular structure of $(HfO_2)_{1-x}(Al_2O_3)_x$, the subscript x representing a molecular composition ratio of the $Al_2O_3$ layer ranges from about 0.3 to about 0.6.

6. The method as recited in claim 2, wherein each of the hafnium oxide and the aluminum oxide of the hafnium oxide and aluminum oxide alloyed layer are deposited to have a thickness ranging from about 1 Å to about 10 Å.

7. The method as recited in claim 2, wherein the lower electrode and the upper electrode are made of a material selected from a group consisting of polysilicon, TiN, Ru, $RuO_2$, Pt, Ir, and $IrO_2$.

8. The method as recited in claim 2, wherein:
   the source gas of hafnium and aluminum bound in a single molecule is HfAl $(MMP)_2(OiPr)_5$;
   the oxidation agent is one of $O_2$, $H_2O$, and oxygen plasma; and
   the purge gas is one of $N_2$ and Ar.

\* \* \* \* \*